United States Patent [19]

Mitsuoka et al.

[11] 3,967,138
[45] June 29, 1976

[54] DEVICE FOR FIRING THYRISTOR

[75] Inventors: Hiroshi Mitsuoka; Masayoshi Kumano, both of Amagasaki, Japan

[73] Assignee: Mitsubishi Denki Kabushiki Kaisha, Japan

[22] Filed: Dec. 12, 1974

[21] Appl. No.: 531,984

[30] Foreign Application Priority Data

Dec. 15, 1973 Japan............................ 48-141091

[52] U.S. Cl............................ 307/252 J; 307/305; 307/311; 323/22 SC
[51] Int. Cl.² ........................................ H03K 17/72
[58] Field of Search......... 307/252 J, 252 N, 252 Q, 307/311, 305; 323/22 SC, 36, 39

[56] References Cited
UNITED STATES PATENTS

| | | | |
|---|---|---|---|
| 3,621,296 | 11/1971 | Berger | 307/252 N |
| 3,723,887 | 3/1973 | Panico | 307/252 N |

*Primary Examiner*—John Zazworsky
*Attorney, Agent, or Firm*—Robert E. Burns; Emmanuel J. Lobato; Bruce L. Adams

[57] ABSTRACT

A capacitor charged with a voltage across anode and cathode of a thyristor after the voltage division and rectification is connected across gate and cathode of the thyristor through a switch while a diode with or without a series reactor is connected across the anode and gate through the same switch. Alternatively a primary winding of an insulating transformer may be connected across the anode and cathode and its secondary winding is operative to charge the capacitor through diodes. The switch is preferably a light switch.

11 Claims, 13 Drawing Figures

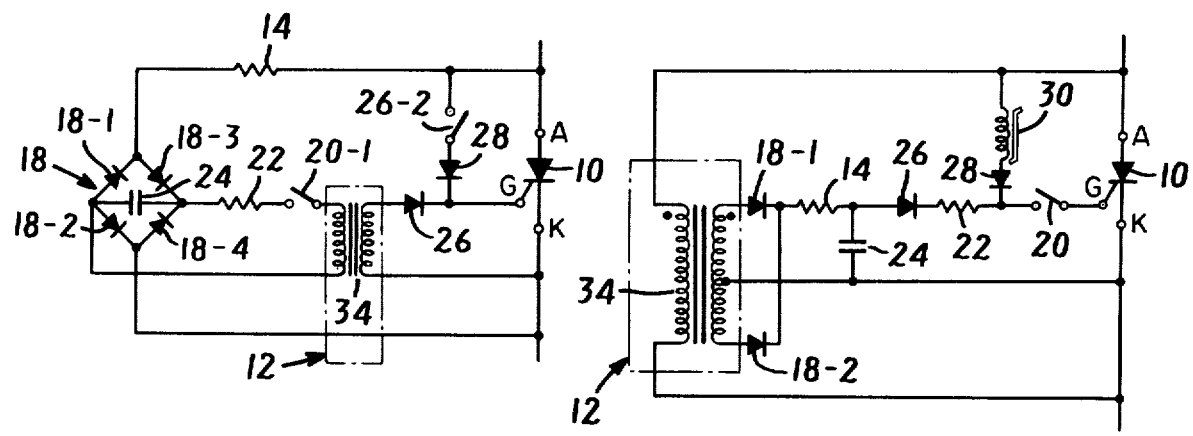
FIG. 4a         FIG. 4b
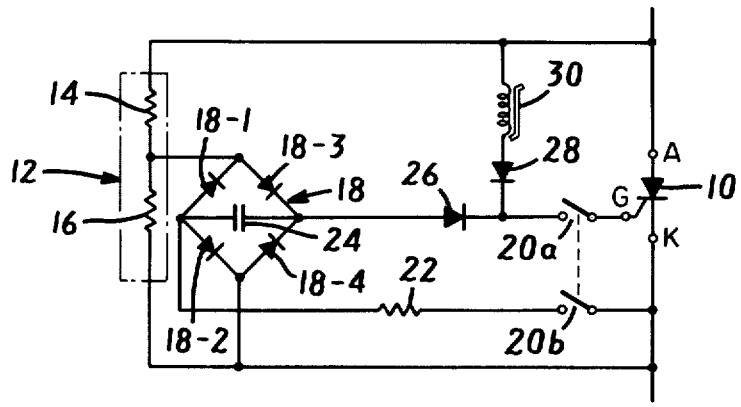
FIG. 4c
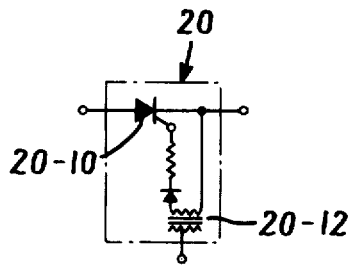   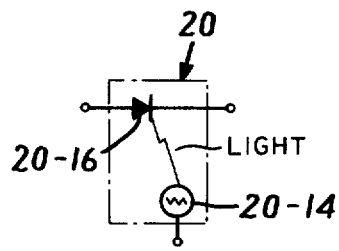   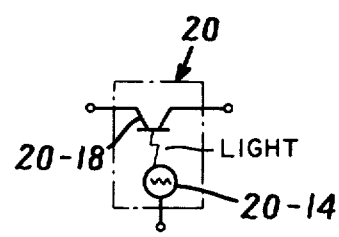
FIG. 5a         FIG. 5b         FIG. 5c
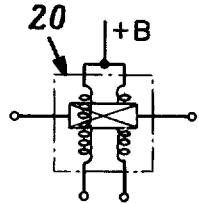   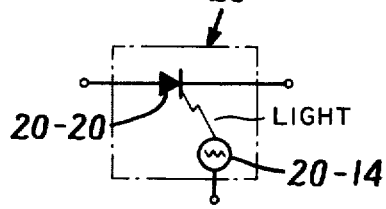
FIG. 5e         FIG. 5d

DEVICE FOR FIRING THYRISTOR

BACKGROUND OF THE INVENTION

This invention relates to a firing device for a thyristor, and more particularly to such a device in which electrical energy required for firing a thyristor is supplied from a voltage applied across the anode and cathode terminals thereof.

Firing devices of the type referred to are advantageous in that their construction is simplified but disadvantageous in that to maintain the gate current or pulse at a predetermined magnitude and broaden the pulsewidth thereof inevitably leads to an increase in loss, and with the gate pulse required to broaden in pulsewidth, the time delay for refiring can not be decreased unless the loss is increased and so on.

It is an object of the present invention to provide a new and improved device for effectively firing the thyristor in various thyristor circuits including those necessarily using a wide gate pulse without an increase in loss.

It is another object of the present invention to provide a new and improved device for firing a thyristor with a simplified construction and without the necessity of separately providing means for supplying electrical energy for firing the thyristor.

It is still another object of the present invention to provide a new and improved device for firing a thyristor in which the supply of firing energy to the thyristor is isolated from the generation of a signal for controlling a firing time thereby to prevent malfunction due to noise.

SUMMARY OF THE INVENTION

The present invention provides a device for firing a thyristor, comprising a thyristor to be fired including an anode terminal, a cathode terminal and a gate terminal, a gate capacitor capable of charging with a voltage applied across the anode terminal and the cathode terminal of the thyristor, first means for connecting the gate capacitor across the gate terminal and the cathode terminal of the thyristor, and second means for connecting the anode terminal to the gate terminal of the thyristor during a predetermined time interval.

BRIEF DESCRIPTION OF THE DRAWINGS

The present invention will become more readily apparent from the following detailed description taken in conjunction with the accompanying drawings in which:

FIGS. 4a, 4b and 4c are diagrams similar to FIG. 2 but illustrating different modifications of the present invention; and FIGS. 5a through 5e are circuit diagrams of firing control switches that may be used in the present invention.

DESCRIPTION OF THE PREFERRED EMBODIMENTS

Figure 1:
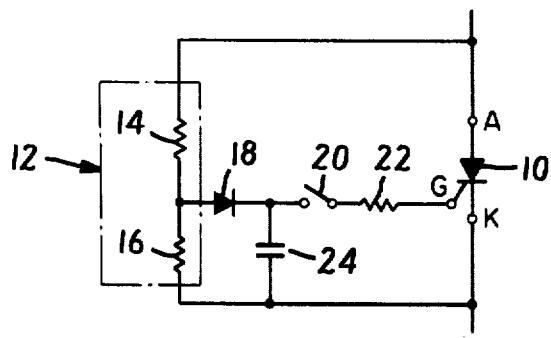
FIG. 1 is a schematic circuit diagram of an anode supply type firing device for a thyristor constructed in accordance with the principles of the prior art.

Referring now to the drawings and FIG. 1 in particular, there is illustrated an anode supply type firing device for a thyristor constructed in accordance with the principles of the prior art. The arrangement illustrated comprises a thyristor 10 including an anode terminal A, a cathode terminal K and a gate terminal G, and a voltage divider circuit generally designated by the reference numeral 12. The anode and cathode terminals A and K respectively are connected across a source of electric power (not shown), and the voltage divider circuit 12 is formed of a pair of serially connected resistors 14 and 16 connected across the anode and cathode terminals A and K of the thyristor 10 or across the source not shown. The junction of the resistors 14 and 16 is connected to the gate terminal G of the thyristor 10 through a semiconductor diode 18, a firing control switch 20 and a resistor 22 interconnected in series circuit relationship. A gate capacitor 24 is connected across the resistor 16 through the diode 18.

During the non-conduction of the thyristor 10, the voltage dividing circuit 12 is operative to divide a voltage across the anode and cathode terminals A and K of the thyristor 10 or across the source not shown as determined by a ratio of the resistances of the resistors 14 and 16, and the diode 18 rectifies the divided portion of the voltage across the resistor 16. The rectified voltage from the diode 18 charges the gate capacitor 24. As a result, a charged voltage across the gate capacitor 24 is always of a magnitude determined by a maximum voltage applied across the anode and cathode terminals A and K of the thyristor 10 and divided by a predetermined fixed value. This ensures that, if the applied voltage is greatly varied, a sufficient quantity of firing energy is accumulated on the gate capacitor 24.

Then at a time point where the thyristor 10 is to be fired, the firing control switch 20 is turned on to cause an electric charge accumulated on the gate capacitor 24 to be supplied to the gate terminal G through the resistor 22 serving to limit the resulting gate current. This results in a flow of a gate current in the form of a pulse and hence in the turn-on of the thyristor 10.

Devices for firing thyristors such as shown in FIG. 1 have been practically useful because it is not required to separately provide an electric source for supplying the gate current and use a electrically insulating transformer for supplying the electric power, resulting in the simplified construction.

In the arrangement of FIG. 1, the gate pulse has a pulsewidth as determined by a time constant provided by both the gate capacitor 24 and the resistor 22 on the one hand, and a charging time for the gate capacitor 24 is determined by both the impedance of the voltage dividing circuit 12 and the capacitance of the gate capacitor 24 on the other hand. Therefore in order to maintain the gate current at a predetermined magnitude while sufficiently broadening the pulsewidth thereof, the voltage divider circuit 12 must decrease in impedance. This results in an increased loss. For these reasons, conventional devices such as shown in FIG. 1 have been generally able only to supply a gate pulse having a minimum amplitude and a minimum pulsewidth required for firing the thyristor.

However where rectifier circuits employing thyristors frequently lag in firing phase, the current may be intermittent due to the relationhip between the reactance and resistance of the circuit. Under these circumstances, the thyristor as shown in FIG. 1 can be brought into its non-conducting state leading to a large variation in the resulting DC voltage. This is undesirable in view of the control Also with thyristors serially interconnected, the circuit switching recovery time may be different from one to another of the thyristors so that the circuit voltage will be applied across that thyristor which has first recovered. This has resulted in the disadvantage that the latter thyristor is applied with a voltage in excess of its breakdown voltage and may be damaged.

Further in the applications where the so-called broad pulse is required as in loads with lagging power factors connected to forcedly switched inverters, the firing device as shown in FIG. 1 has been not suitable because a time delay for re-firing which can not be decreased without an increase in loss.

The present invention contemplates to eliminate the disadvantages of the prior art practice as above described.

Figure 2:
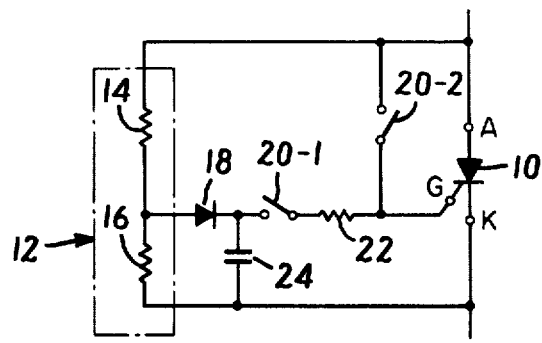
FIG. 2 is a schematic circuit diagram of a firing device for a thyristor constructed in accordance with the principles of the present invention.

Referring now to FIG. 2 wherein like reference numerals designate the components identical to those shown in FIG. 1, there is illustrated a firing device for a thyristor constructed and operated in accordance with the principles of the present invention. The arrangement illustrated is different from that shown in FIG. 1 only in that, in FIG. 2 a shortcircuiting switch 20-2 is connected across the anode and gate terminals A and G of the thyristor 10 with the firing control switch designated by the reference numeral 20-1.

As in the arrangement of FIG. 1, the gate capacitor 24 is charged with a substantially maximum magnitude of a voltage provided by dividing the forward voltage applied across the anode and cathode terminals A and K of the thyristor 10.

At a time point where the thyristor is to be fired, the firing control switch 20-1 is closed to initiate the conduction of the thyristor 10 as above described in conjunction with FIG. 1. After the voltage across the anode and cathode terminals A and K of the thyristor 10 has been sufficiently lowered, the shortcircuiting switch 20-2 is put in its closed position to shortcircuit the anode terminal A to the gate terminal G whereby the gate current continues to flow into the gate terminal G. As a result, the thyristor is in its quasi-conducting state even though the anode current would become null in a time interval for which the thyristor is to be maintained in its conducting state. This prevents a high voltage from being applied across the anode and cathode terminals A and K of the thyristor 10. Also even if the thyristor would be reversely biased to be non-conducting in the time interval just described, the next application of the forward voltage permits the thyristor to be again conductive as long as the shortcircuiting switch 20-2 is maintained in its closed position. Therefore, forced switching inverters can perform with stable operation even under lagging loading.

From the foregoing it will be appreciated that, in the arrangement of FIG. 2, firing energy from the gate capacitor 24 is required only to be applied in the form of a pulse to the gate terminal G of the thyristor 10 at the beginning of the turn-on of the thyristor, and the loss can be minimized because the impedance of the voltage dividing circuit 12 can be selected to be sufficiently high.

Figure 3A:
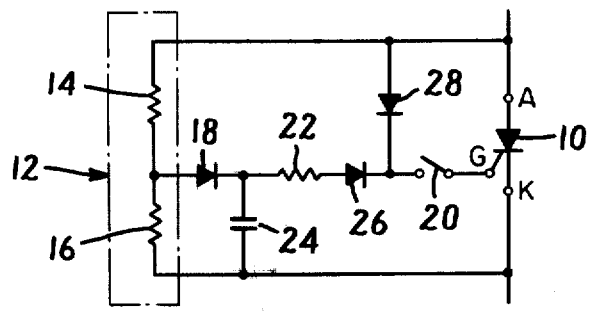
FIGS. 3a through 3c are diagrams similar to FIG. 2 but illustrating various modifications of the present invention.
Figure 3B:
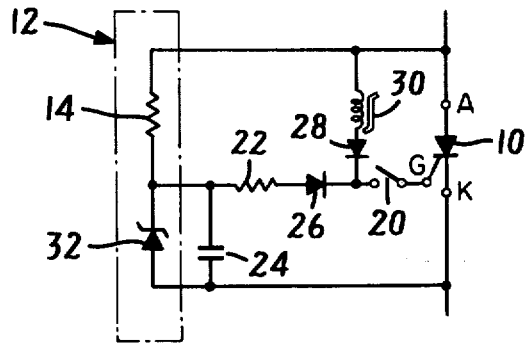
Figure 3C:
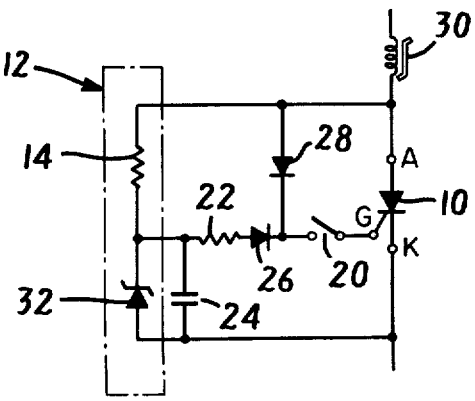

In FIG. 3 wherein like reference numerals designates the components identical to those shown in FIG. 2, there are illustrated modifications of the present invention in which the firing control switch also serves as the shortcircuiting switch and is designated by the reference numeral 20. In the arrangement as shown in FIG. 3a, a semiconductor discharge diode 26 is connected between the current limiting resistor 22 and the firing control switch 20 subsequently connected to the gate terminal G of the thyristor 10 while another semiconductor diode 28 is connected across the anode and gate terminals A and G of the thyristor 10 through the switch 20. As in the arrangement of FIG. 2, the firing control switch 20 can be closed to cause the electric energy accumulated on the gate capacitor 24 to be supplied to the gate terminal G of the thyristor 10 through the current limiting resistor 22, the diode 26 and the now closed switch 20. At the same time, the diode 28 provides a shortcircuit across the anode and gate terminals A and G respectively. Thus the diode 28 further supplies a rectified gate current to the gate terminals but may cause a danger that a gate current having an excessive magnitude will flow into the gate terminal G therethrough at the beginning of the turn-on operation. In order to avoid this objection, means for suppressing that excessive gate current is shown in FIGS. 3b and 3c as including a reactor or inductor 30 connected to the diode 28. The reactor 30 is serially connected to the diode 30 across the anode and gate terminals A and G of the thyristor 10 through the switch 20 in FIG. 3b while it is connected to the anode electrodes of the diode and thyristor 28 and 10 respectively in FIG. 3c. In these arrangements, the voltage divider circuit 12 is formed of the resistor 14 and a constant voltage diode 32 such as a Zener diode serially connected thereto in order to limit a voltage charged on the gate capacitor 24, that is, a voltage applied to the gate terminal G of the thyristor 10 to a predetermined fixed magnitude.

In the arrangement of FIG. 3b, the reactor 30 is operative to limit a rise of a shortcircuiting current flowing across the thyristor 10 anode and gate terminals A and K respectively at the instant the switch 20 has been closed. Thus the gate current is substantially drawn only from the charged capacitor 24 until the thyristor 10 is turned on. Thereafter when the voltage across the anode and cathode terminals A and K of the thyristor 10 decreases, the reactor 30 can supply a constant gate current to the gate terminal G to maintain the thyristor 10 in its conducting state. In a time interval for which the thyristor is to be fired, the thyristor may be once extinguished and then again have applied a forward voltage to begin to be conductive. Even if that forward voltage becomes oscillatory at a time point where the thyristor is initiated to be conductive as just described, the reactor 30 is operative to permit the constant gate current to continue to flow into the gate terminal G.

It is to be understood that the reactor 30 may be of the saturable type.

In the arrangement of FIG. 3c the reactor 30 performs, in addition to the function of limiting a rise of a shortcircuiting current as above described, the function of limiting both a rate of change of the anode current (di/dt) through the thyristor and a rate of change of the voltage (dv/dt) across the anode and cathode electrodes thereof.

In the arrangements as shown in FIGS. 3a, 3b and 3c, the diode 28 serves to prevent damage to the thyristor 10 resulting from a reverse voltage applied across the gate and cathode terminals G and K of the thyristor 10 during the application of a corresponding reverse voltage across the anode and cathode terminals A and K thereof. With the thyristor 10 having, for example, a semiconductor diode connected in anti-parallel circuit relationship therewith although such a diode is not illustrated, the diode 28 may be omitted.

In general, thyristors have applied across the anode and cathode terminals thereof a voltage having a highly variable mean magnitude. For example, with rectifier circuits employing thyristors, the firing control angle $\alpha$ is variable between 0 and $\pi$ radians whereas the mean magnitude of the voltage applied across the thyristor is variable between its negative and its positive maximum. Therefore with the firing control angle $\alpha$ having a value approximating zero, it is difficult to charge the gate capacitor 24 with the positive polarity alone because a positive voltage is scarcely applied thereacross.

To avoid this difficulty, the present invention can be realized with embodiments as shown in FIGS. 4a, 4b and 4c wherein like reference numerals designate the components identical to those shown in FIGS. 2 and 3. In the arrangements illustrated, a voltage applied across the anode and cathode terminals of the thyristor 10, though its polarity would be either positive or negative, is effective for charging the gate capacitor 24 ensuring that the capacitor is charged with a predetermined quantity of firing energy.

In the arrangement of FIG. 4a, a rectifier bridge generally designated by the reference numeral 18 includes four semiconductor diodes 18-1, 18-2, 18-3 and 18-4 and has a pair of AC input terminals connected across the anode and cathode terminals A and K of the thyristor 10 or across a power source (not shown) through the resistor 14. The rectifier bridge 18 has a pair of DC output terminals across which the gate capacitor 24 is connected. The output terminals of the bridge 18 are also connected through the current limiting resistor 22 and the firing control switch 20-1 across a primary winding of an isolation transformer 34 shown in dotted block 12. The isolation transformer 34 has a secondary winding connected across the gate and cathode terminals G and K of the thyristor 10 through the diode 26. Then the shortcircuiting switch 20-2 and the diode 28 are serially interconnected across the anode and gate terminals A and G of the thyristor 10.

In the arrangement of FIG. 4b, an isolation transformer 34 also shown in dotted block 12 includes a primary winding connected across the anode and cathode terminals A and K of the thyristor 10 or across a power source not shown and a secondary winding with a center tap. Both ends of the secondary winding are connected by respective rectifier diodes 18-1 and 18-2 to the resistor 14 subsequently connected to the center tap through the gate capacitor 24. The gate capacitor 24 is electrically coupled to the thyristor 10 in the same manner as above described in conjunction with FIG. 3b.

In the arrangements as shown in FIGS. 4a and 4b, the isolation transformer 34 acts as the voltage divider circuit as above described in conjunction with FIG. 1 and also serves to apply a relatively low voltage to the gate terminal G of the thyristor 10 even with a high voltage applied across the anode and cathode terminals A and K thereof.

In the arrangement of FIG. 4c, the isolation transformer as shown in FIGS. 4a or 4b is omitted and instead, the voltage divider circuit 12 is connected across the anode and cathode terminals A and K of the thyristor 10 as in the arrangement of FIG. 2. The voltage dividing resistor 16 has connected thereacross a pair of AC input terminals of a rectifier bridge 18 with the gate capacitor 24 such as shown in FIG. 4a. The rectifier bridge 18 has one of the DC output terminals connected to the gate terminal G of the thyristor 10 through the diode 26 and one pole 20-a of the firing control switch and the other DC output terminal connected to the cathode terminal K of the thyristor 10 through the current limiting resistor 22 and the other pole 20-b of the switch. Also the reactor 30 and the diode 28 are electrically coupled to the thyristor 10 as in the arrangement of FIG. 4b.

In the arrangement of FIG. 4c the firing control switch 20-a, 20-b is closed to connect the gate capacitor 24 across the gate and cathode terminals A and K of the thyristor 10 so that it is possible to charge the gate capacitor 24 with a voltage applied across the anode and cathode terminals A and K of the thyristor 10 only upon its firing even though the polarity of the voltage would be either positive or negative.

In the arrangements as shown in FIGS. 4a, 4b and 4c the capacitor and resistor 24 and 14 respectively are possible to utilize partly or entirely any of the conventional absorber circuits for limiting the dv/dt of and the surge voltage across thyristors.

FIGS. 5a through 5e show various types of the firing control switch 20 that may be used in the present invention and indeed as either of the switches 20-1 and 20-2.

FIG. 5a shows one form of the firing control switch 20 comprising a firing thyristor 20-10 electrically coupled to a pulse transformer 20-12 through a resistor and a diode. The purpose of the pulse transformer 20-12 is to electrically isolate a control signal applied to the thyristor 20-10 from a firing energy supplied to the gate terminal G of the thyristor 10. Alternatively a semiconductor luminescent diode 20-14 may be optically coupled to a semiconductor photodiode 20-16 (FIG. 5b), a phototransistor 20-18 (FIG. 5c) or a photo-thyristor 20-20 (FIG. 5d).

The firing control switches 20 as shown in FIGS. 5b, 5c and 5d respectively are adapted to be closed in response to the reception of light from the respective luminescent diodes 20-14. Therefore the use of any of those switches prevents the firing devices as above described from malfunctioning due to noise.

FIG. 5e shows a magnetic switch such as a semiconductor magnetically sensitive diode.

In summary, the present invention is operative to apply electrical energy, charged on the gate capacitor by the voltage applied across the anode and cathode terminals of thyristors during the OFF time interval, to the gate terminal thereof upon firing while providing a short-circuit across the anode and gate terminals thereof during the entire time interval for which the thyristors are to be in their ON state. Therefore the present invention is applicable to uses requiring the gate trigger pulse broad in pulsewidth, for example, to rectifier circuits having the current intermitted, forced switched inverters etc. without the gate firing device increased in loss. The present device is also simplified by eliminating the necessity of separately providing means for supplying firing energy to the gate terminal of thyristors. Further, by electrically isolating the firing energy from the firing control signal, one can readily take a measure to prevent thyristors from being erroneously fired due to noise.

While the present invention has been illustrated and described in conjunction with several preferred embodiments thereof it is to be understood that various changes and modifications may be resorted to without departing from the spirit and scope of the present invention.

What we claim is:

1. A device for firing a thyristor, comprising; a thyristor to be fired including an anode terminal, a cathode terminal and a gate terminal, a gate capacitor capable of charging with a voltage applied across said anode terminal and said cathode terminal of said thyristor, means for charging said gate capacitor with said voltage, means operable for connecting said gate capacitor across said gate terminal and said cathode terminal of said thyristor, and means for effecting substantially a short-circuit from said anode terminal to said gate terminal of said thyristor upon the operation of said means operable for connecting said gate capacitor.

2. A device for firing a thyristor as claimed in claim 1 wherein said means for charging comprises voltage divider means for dividing said voltage applied across said anode terminal and said cathode terminal of said thyristor, and said gate capacitor is charged with the divided portion of the voltage from said voltage divider means.

3. A device for firing a thyristor as claimed in claim 2 wherein said voltage divider means is formed of a resistance element and a constant voltage element serially interconnected.

4. A device for firing a thyristor as claimed in claim 1 wherein a full-wave rectifier circuit is provided full-wave rectifying said voltage applied across said anode terminal and cathode terminal of said thyristor to produce a full-wave rectified output voltage, and said gate capacitor is charged with said full-wave rectified output voltage from said full-wave rectifier circuit.

5. A device for firing a thyristor as claimed in claim 1 wherein an electrically insulating transformer is provided including a primary winding connected across said anode terminal and said cathode terminal of said thyristor and a secondary winding connected to said gate capacitor through a semiconductor diode.

6. A device for firing a thyristor, comprising a thyristor to be fired including an anode terminal, a cathode terminal and a gate terminal, voltage deriving means for deriving a voltage applied across said anode terminal and said cathode terminal of said thyristor and defining a charging path having a predetermined impedance, a switching element, a gate capacitor connected across said gate terminal and said cathode terminal of said thyristor through said switching element, said gate capacitor being charged with an output from said voltage deriving means through said charging path and responsive to the closure of said switching element to deliver a discharging current to said gate terminal of said thyristor for firing the thyristor, and means for connecting substantially a short-circuit having an impedance less than said predetermined impedance from said anode terminal to said gate terminal of said thyristor through said switching element after said gate capacitor has been initiated to discharge.

7. A device for firing a thyristor as claimed in claim 6 wherein said means for connecting includes a reactor.

8. A device for firing a thyristor, comprising a thyristor to be fired including an anode terminal, a cathode terminal and a gate terminal voltage deriving means for deriving a voltage applied across said anode terminal and said cathode terminal of said thyristor, a first switching element, a gate capacitor connected across said gate terminal and said cathode terminal of said thyristor through said first switching element, said gate capacitor being charged with an output from said voltage deriving means, and a second switching element disposed between said anode terminal and said cathode terminal of said thyristor to be closed after the closure of said first switching element, thereby to connect said anode terminal to said gate terminal of said thyristor.

9. A device for firing a thyristor as claimed in claim 8 wherein circuit means including said gate capacitor and said gate terminal and said cathode terminal of said thyristor has connected therein an electrically insulating transformer including a primary winding connected to both said gate capacitor and said first switching element and a secondary winding connected across said gate terminal and said cathode terminal of said thyristor.

10. A device for firing a thyristor as claimed in claim 6 wherein said switching element is formed of a light switch.

11. A device for firing a thyristor as claimed in claim 8 wherein each of said first and second switching elements is formed of a light switch.

* * * * *